US012763792B2

(12) United States Patent
Karimi et al.

(10) Patent No.: US 12,763,792 B2
(45) Date of Patent: Oct. 13, 2026

(54) METHODS OF CONSTRUCTING AND USING LOW-POWER QDE-ZIPPER CODES, AND SYSTEMS, APPARATUSES, METHODS, AND NON-TRANSITORY COMPUTER-READABLE STORAGE DEVICES EMPLOYING SAME

(71) Applicant: HUAWEI TECHNOLOGIES CO., LTD., Shenzhen (CN)

(72) Inventors: Bashirreza Karimi, Ottawa (CA); Yoones Hashemi Toroghi, Stittsville (CA); Hamid Ebrahimzad, Ottawa (CA)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 21 days.

(21) Appl. No.: 18/671,663

(22) Filed: May 22, 2024

(65) Prior Publication Data

US 2025/0365008 A1 Nov. 27, 2025

(51) Int. Cl.
*H03M 7/30* (2006.01)

(52) U.S. Cl.
CPC ....... *H03M 7/3066* (2013.01); *H03M 7/6005* (2013.01); *H03M 7/6011* (2013.01)

(58) Field of Classification Search
CPC . H03M 7/3066; H03M 7/6011; H03M 7/6005
See application file for complete search history.

(56) References Cited

U.S. PATENT DOCUMENTS 5,910,967 A * 6/1999 Vanderaar ........... H03M 13/253 375/265
6,643,332 B1 * 11/2003 Morelos-Zaragoza ..................... H04L 27/345 375/265

(Continued)

FOREIGN PATENT DOCUMENTS

CN 114513214 A 5/2022
CN 116455410 A 7/2023

(Continued)

OTHER PUBLICATIONS

International Search Report and Written Opinion for PCT/CN2025/096603 dated Aug. 26, 2025.

(Continued)

*Primary Examiner* — Lam T Mai
(74) *Attorney, Agent, or Firm* — Tim Tingkang Xia, Esq.; Troutman Pepper Locke LLP

(57) ABSTRACT

A method for encoding information bits using a zipper code. The zipper is associated with a real buffer for receiving the information bits, a first virtual buffer, a second virtual buffer, and two mapping functions $\phi_1$ and $\phi_2$. Each row of the real buffer, a corresponding row of the first virtual buffer, and a corresponding row of the second virtual buffer form a codeword of a component code. The two mapping functions $\phi_1$ and $\phi_2$ are for mapping each group of c bits in each row of the real buffer to c bits in one or more subsequent rows of the first virtual buffer and to c bits in one or more (Continued)

subsequent row of the second virtual buffer, respectively. The c bits in the first virtual buffer are in different rows thereof, and/or the c bits in the second virtual buffer are in different rows thereof.

18 Claims, 10 Drawing Sheets

(56) References Cited

U.S. PATENT DOCUMENTS

| | | | | |
|---|---|---|---|---|
| 8,024,636 | B2 * | 9/2011 | Laprade | H03M 13/2972 714/755 |
| 10,291,264 | B2 * | 5/2019 | Zhang | H03M 13/13 |
| 10,567,011 | B2 * | 2/2020 | Zhang | H04L 1/0068 |
| 11,063,614 | B1 * | 7/2021 | Chen | H03M 13/45 |
| 11,239,944 | B1 * | 2/2022 | Pan | H03M 13/251 |
| 11,658,682 | B2 * | 5/2023 | Lee | H03M 13/451 714/752 |
| 12,206,494 | B2 * | 1/2025 | Ma | H03M 13/271 |
| 2014/0229788 | A1 * | 8/2014 | Richardson | H03M 13/1188 714/752 |
| 2017/0353267 | A1 * | 12/2017 | Kudekar | H04L 1/0061 |
| 2018/0183464 | A1 * | 6/2018 | Ge | H03M 13/13 |
| 2019/0158222 | A1 * | 5/2019 | Kurmaev | H03M 13/6362 |
| 2020/0067642 | A1 * | 2/2020 | Hui | H04L 1/0071 |
| 2020/0099469 | A1 * | 3/2020 | Jiang | H04L 1/0057 |
| 2023/0072039 | A1 | 3/2023 | Karimi et al. | |
| 2024/0146332 | A1 * | 5/2024 | Barakatain | H03M 13/3738 |
| 2024/0204913 | A1 * | 6/2024 | Hashemi Toroghi | H04L 1/0052 |

FOREIGN PATENT DOCUMENTS

| | | | |
|---|---|---|---|
| CN | 116491072 | A | 7/2023 |
| CN | 117294316 | A | 12/2023 |

OTHER PUBLICATIONS

M. Shehadeh, F. R. Kschischang, and A. Y. Sukmadji, "Generalized staircase codes with arbitrary bit degree," to be presented at OFC 2024.

B. P. Smith, A. Farhood, A. Hunt, F. R. Kschischang, and J. Lodge, "Staircase codes: FEC for 100 GB/s OTN," J. Lightw. Technol., vol. 30, No. 1, pp. 110-117, Jan. 1, 2012.

A. Y. Sukmadji, U. Martínez-Peñas, and F. R. Kschischang, "Zipper codes: Spatially-coupled product-like codes with iterative algebraic decoding," in Proc. Can. Workshop Inf. Theory, Jun. 2-5, 2019.

Karimi, Bashirreza, Masoud Barakatain, Yoones Hashemi, Deyuan Chang, Hamid Ebrahimzad, and Chuandong Li. "Low-Latency Low-Overhead Zipper Codes", pp. Tu5-34. ECOC, Sep. 18-22, 2022.

M. Barakatain, Y. Hashemi, B. Karimi, H. Ebrahimzad and C. Li, "Low-Complexity Zipper-LDPC and Low-Latency Zipper-BCH Concatenated Codes," J. Lightw. Technol., vol. 41, No. 24, pp. 7328-7335, Dec 15, 2023.

M. Shehadeh, F. R. Kschischang, and A. Y. Sukmadji, "Generalized staircase codes with arbitrary bit degree," to be presented at OFC 2024, Mar. 24-28, 2024.

* cited by examiner

METHODS OF CONSTRUCTING AND USING LOW-POWER QDE-ZIPPER CODES, AND SYSTEMS, APPARATUSES, METHODS, AND NON-TRANSITORY COMPUTER-READABLE STORAGE DEVICES EMPLOYING SAME

FIELD OF THE DISCLOSURE

The present disclosure relates generally to coding methods, and in particular to methods of constructing and using low-power QDE-zipper codes, and systems, apparatuses, methods, and non-transitory computer-readable storage devices employing same.

BACKGROUND

Spatially-coupled product-like hard-decision (HD) forward error correction (FEC) codes (such as staircase codes, diagonal-zipper codes, quasi-diagonal with extra level of protection (QDE) zipper codes, and the like) and related coding/decoding methods are important in various applications such as reliable high-speed optical communication systems, wherein these codes have impact on the power of optical transceivers.

Therefore, it is always a desire to optimize the HD FEC codes and related coding/decoding methods.

SUMMARY

According to one aspect of this disclosure, there is provided a first method for encoding a plurality of information bits into a plurality of coded bits, the first method comprising: encoding the plurality of information bits into the plurality of coded bits using a zipper code associated with a first mapping function $\phi_1$ and a second mapping function $\phi_2$; the zipper code is associated with a real buffer, a first virtual buffer, and a second virtual buffer, each comprising a plurality of sections; each section of the real buffer, a corresponding section of the first virtual buffer, and a corresponding section of the second virtual buffer form a codeword of a component code; the real buffer is for receiving the plurality of information bits into the plurality of sections thereof; the first mapping function $\phi_1$ and the second mapping function $\phi_2$ are for mapping each group of c bits, where c>1 is an integer, in each section of the real buffer to c mapped bits in one or more first subsequent sections of the first virtual buffer and to c mapped bits in one or more second subsequent sections of the second virtual buffer, respectively; and the c mapped bits in the first virtual buffer are in different sections thereof, and/or the c mapped bits in the second virtual buffer are in different sections thereof.

In some embodiments, when bit positions of the sections of the real buffer, bit positions of the sections of the first virtual buffer, and bit positions of the sections of the second virtual buffer are separately and correspondingly numbered, for each section of the real buffer, the bit positions of the bits in the section of the real buffer, the bit positions of the corresponding mapped bits in any one of the one or more first subsequent sections of the first virtual buffer, and the bit positions of the corresponding mapped bits in any one of the one or more second subsequent sections of the second virtual buffer only have one bit position in common.

In some embodiments, when the bits of each section of the first virtual buffer are indexed from 1 to m (m>1 is an integer), the bits of each section of the second virtual buffer are indexed from m+1 to 2m, and the bits of each section of the real buffer are indexed from 2m+1 to 3m, the first mapping function $\phi_1$ maps j-th bit (j=2m+1, . . . , 3m) of i-th row of the real buffer to $j_1$-th bit of $i_1$-th row of the first virtual buffer, and $$(i_1, j_1) = \phi_1(i, j) = \begin{cases} i + \left\lceil \frac{3}{2}\left(\frac{m}{c}\right) \right\rceil - (j-2m)\,\%\left\lfloor \frac{m}{2c} \right\rfloor, (j-2m), & j < \left\lfloor \frac{m}{2} \right\rfloor, \\ i + (j-2m)\,\%\left\lfloor \frac{m}{2c} \right\rfloor + 1, (j-2m), & \text{otherwise,} \end{cases},$$

where $\lceil x \rceil$ is a function returning a smallest integer that is greater than or equal to x, $\lfloor y \rfloor$ is a function returning a greatest integer that is smaller than y, and a % b represents a modulo function returning a remainder of a divided by b, and the second mapping function $\phi_2$ maps the j-th bit of the i-th row of the real buffer to $j_2$-th bit of $i_2$-th row of the second virtual buffer, and $$(i_2, j_2) = \phi_2(i, j) = i + \left\lfloor \frac{(j-2m)}{c} \right\rfloor + 1, (j-m).$$

In some embodiments, c=3.

In some embodiments, the component code is a Bose-Chaudhuri-Hocquenghem (BCH) code.

In some embodiments, the first method has an error correction capability of less than or equal to 4.

In some embodiments, the first method has an error correction capability of 2 or 3.

According to one aspect of this disclosure, there is provided a second method comprising: decoding a plurality of coded bits into a plurality of information bits using a zipper code associated with a first mapping function $\phi_1$ and a second mapping function $\phi_2$; the zipper code is associated with a real buffer, a first virtual buffer, and a second virtual buffer, each comprising a plurality of sections; each section of the real buffer, a corresponding section of the first virtual buffer, and a corresponding section of the second virtual buffer form a codeword of a component code; the real buffer is for receiving the plurality of coded bits into the plurality of sections thereof; the first mapping function $\phi_1$ and the second mapping function $\phi_2$ are for mapping bits in each section of the real buffer to a plurality of first subsequent sections of the first virtual buffer and to bits in one or more second subsequent sections of the second virtual buffer, respectively; and said decoding the plurality of coded bits comprises: determining that a syndrome of a first codeword is nonzero, the first codeword comprising a first one of the plurality of sections of the real buffer, and corresponding to plurality of second codewords comprising bits mapped from the bits of the first one of the plurality of sections of the real buffer, calculating syndromes of the plurality of second codewords, determining values of a plurality of variables, each of the plurality of variables corresponding to one of the plurality of second codewords, and having a value of binary zero if the syndrome of the corresponding second codeword is zero or a value of binary one if the syndrome of the corresponding second codeword is nonzero, and correcting a plurality of bits of the first one of the plurality of sections of the real buffer by determining values thereof based on the values of the plurality of variables.

In some embodiments, said correcting the plurality of bits of the first one of the plurality of sections of the real buffer comprises: for each bit of the first one of the plurality of sections of the real buffer, combining a subset of the plurality of variables to obtain an indication, the subset of the plurality of variables corresponding to a subset of the plurality of second codewords that comprise the mapped bits mapped from the bit of the first one of the plurality of sections of the real buffer, and the indication indicating whether or not the corresponding bit of the first one of the plurality of sections of the real buffer is corrupted; and for P indications that indicate the corresponding bit is corrupted, selecting a possible value combination of the P corresponding bits that causes the first codeword to have a zero-value syndrome as the values thereof.

In some embodiments, the selected possible value combination of the P corresponding bits is a possible value combination that has a smallest Hamming weight and causes the first codeword to have the zero-value syndrome.

In some embodiments, the first mapping function $\phi_1$ and the second mapping function $\phi_2$ are for mapping each group of c bits, where $c>1$ is an integer, in each section of the real buffer to c mapped bits in one or more of the first subsequent sections of the first virtual buffer and to c mapped bits in one or more of the second subsequent sections of the second virtual buffer, respectively; and the c mapped bits in the first virtual buffer are in different sections thereof, and/or the c mapped bits in the second virtual buffer are in different sections thereof.

In some embodiments, when bit positions of the sections of the real buffer, bit positions of the sections of the first virtual buffer, and bit positions of the sections of the second virtual buffer are separately and correspondingly numbered, for each section of the real buffer, the bit positions of the bits in the section of the real buffer, the bit positions of the corresponding mapped bits in any one of the one or more first subsequent sections of the first virtual buffer, and the bit positions of the corresponding mapped bits in any one of the one or more second subsequent sections of the second virtual buffer only have one bit position in common.

According to one aspect of this disclosure, there is provided one or more processors functionally coupled to one or more non-transitory computer-readable storage devices, the one or more non-transitory computer-readable storage devices comprising computer-executable instructions, wherein the instructions, when executed, cause the one or more processors to perform the above-described first and/or second method.

According to one aspect of this disclosure, there is provided one or more non-transitory computer-readable storage media comprising computer-executable instructions, wherein the instructions, when executed, cause one or more processors to perform the above-described first and/or second method.

The methods, the one or more processors, and the one or more non-transitory computer-readable storage media disclosed herein provide low-power quasi-diagonal with extra level of protection (QDE) zipper codes that are suitable for applications and products with low-overhead, low-latency, and low-power requirements, and may be used in applications and products where low-power and low-latency hard-decision (HD) forward error correction (FEC) is required, such as in optical communication systems that require low-power consumptions in a concatenated FEC structure.

The methods, the one or more processors, the one or more non-transitory computer-readable storage media, and the low-power QDE-zipper codes disclosed herein provide enhanced robustness to early error floor in case of small correction capability of component code and small sliding-window memory size. Moreover, the methods disclosed herein may be extended to other spatially-coupled product-like codes such as staircase code, diagonal-zipper code, or other codes with higher level of protection than QDE-zipper code.

BRIEF DESCRIPTION OF THE DRAWINGS

For a more complete understanding of the disclosure, reference is made to the following description and accompanying drawings, in which.

DETAILED DESCRIPTION

A. Hardware Structure

Figure 1:
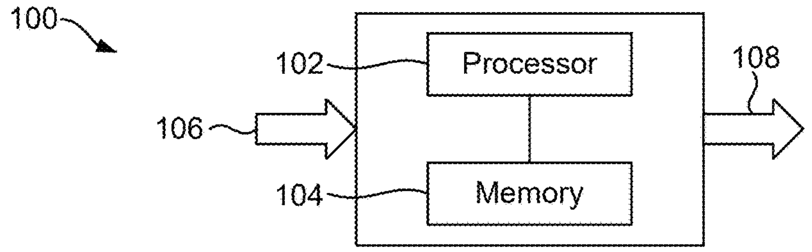
FIG. 1 is a simplified schematic diagram showing the hardware structure of an encoding/decoding module, according to some embodiments of this disclosure.

Turning now the FIG. 1, an encoding and/or decoding module is shown and is generally identified using reference numeral 100. In various embodiments, the encoding/decoding module 100 may be an encoding module for encoding a data piece into a codeword, a decoding module for decoding a codeword into a data piece, or an encoding and decoding module for encoding or decoding an input (which may be a data piece to be encoded or a codeword to be decoded) under respective instructions.

In other words, one may only implement the encoding portion of the encoding/decoding module 100 as an encoding module (also called an "encoder") for encoding a data piece, and rely on a corresponding decoding module (also called a "decoder") for decoding the codeword to retrieve the data piece.

Alternatively, one may only implement the decoding portion of the encoding/decoding module 100 as the decoding module for decoding a codeword wherein the codeword is encoded by a corresponding encoding module.

Yet alternatively, one may implement both the encoding and decoding portions of the encoding/decoding module 100 for encoding a data piece into a codeword, and decoding a codeword to a data piece.

As shown in FIG. 1, the encoding/decoding module 100 comprises a processing structure 102 having one or more processors, a memory 104 having one or more non-transitory computer-readable storage devices or media, one or more input circuits 106 (also denoted as "input" for simplicity), and one or more output circuits 108 (also denoted as "output" for simplicity), all functionally coupled to each other (for example, via one or more buses) and implemented using suitable electrical and/or optical technologies. The encoding/decoding module 100 may also comprise other components as needed, such as one or more buses, one or more controller circuits, and/or the like.

The processing structure 102 comprises necessary circuitries implemented using suitable technologies such as suitable electrical and/or optical hardware components for executing an encoding procedure and/or a decoding procedure, as the design purpose and/or the use case maybe, for encoding and/or decoding inputs received from the one or more input circuits 106 and outputting the resulting codeword or data piece through the one or more output circuits 108.

For example, the processing structure 102 may comprise logic gates implemented by semiconductors to perform various computations, calculations, and/or processings. Examples of logic gates include AND gate, OR gate, XOR (exclusive OR) gate, and NOT gate, each of which takes one or more inputs and generates or otherwise produces an output therefrom based on the logic implemented therein. For example, a NOT gate receives an input (for example, a high voltage, a state with electrical current, a state with an emitted light, or the like), inverts the input (for example, forming a low voltage, a state with no electrical current, a state with no light, or the like), and output the inverted input as the output.

While the inputs and outputs of the logic gates are generally physical signals and the logics or processings thereof are tangible operations with physical results (for example, outputs of physical signals), the inputs and outputs thereof are generally described using numerals (for example, numerals "0" and "1") and the operations thereof are generally described as "computing" (which is how the "computer" or "computing device" is named) or "calculation", or more generally, "processing", for generating or producing the outputs from the inputs thereof.

Sophisticated combination of logic gates such as a plurality of AND, OR, XOR, and/or NOT gates may form a circuitry such as a processor. Such combinations of logic gates may be implemented using individual semiconductors, or more often be implemented as integrated circuits (ICs).

A circuitry of logic gates may be "hard-wired" circuitry which, once designed, may only perform the designed functions. In this example, the processes and functions thereof are "hard-coded" in the circuitry.

With the advance of technologies, it is often that a circuitry of logic gates such as the processing structure 102 having one or more processors may be alternatively designed in a general manner so that it may perform various procedures and functions according to a set of "programmed" instructions implemented as firmware and/or software and stored in one or more non-transitory computer-readable storage devices or media. In this example, the circuitry of logic gates such as the processing structure 102 is usually of no use without meaningful firmware and/or software.

Of course, those skilled the art will appreciate that a procedure or a function (and thus the processing structure 102) may be implemented using other technologies such as analog technologies.

Therefore, the modules, circuitries, the processing structure 102, and other components described herein generally produce tangible results tied to the physical world, wherein the tangible results such as those described herein may lead to improvements to computers and systems, computing devices and systems, communication devices and systems, and/or the like, such as network systems having a plurality of server computers and a plurality of client computing devices.

Referring back to FIG. 1, in various embodiments, each of the one or more processors of the processing structure 102 may be a specialized circuitry implemented as one or more individual circuits, a specialized circuitry implemented as one or more ICs using suitable technologies such as application specific integrated circuits (ASICs), field-programmable gate array (FPGA), and/or the like, a specialized processor, or a general purpose processor such as an INTEL® microprocessor (INTEL is a registered trademark of Intel Corp., Santa Clara, CA, USA), an AMD® microprocessor (AMD is a registered trademark of Advanced Micro Devices Inc., Sunnyvale, CA, USA), an ARM® microprocessor (ARM is a registered trademark of Arm Ltd., Cambridge, UK) manufactured by a variety of manufactures under the ARM® architecture, or the like.

The memory 104 is generally used for storing data such as the input data, the data generated during the operation of the processing structure 102, and/or the output data. In various embodiments, the memory 104 may be a circuitry implemented as one or more individual circuits or a circuitry implemented as one or more ICs. In some embodiments, the memory 104 may be integrated with the processing structure 102 in a single IC. In some other embodiments, the memory 104 may be separated from the processing structure 102 but functionally coupled thereto.

Figure 2A:
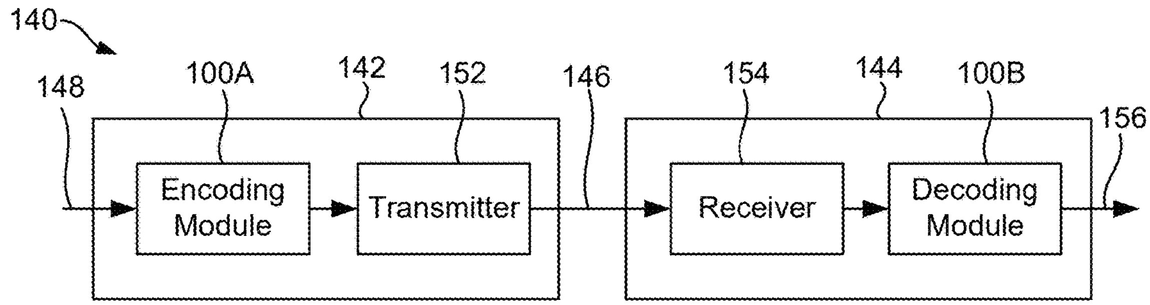
FIG. 2A is a simplified schematic diagram of a communication system having a transmitting device in communication with a receiving device via a communication channel, wherein the transmitting device comprises an encoding module shown in FIG. 1 and the receiving devices comprises a decoding module shown in FIG. 1, according to some other embodiments of this disclosure.

In various embodiments, the encoding/decoding module 100 may be used in various systems and/or devices for data encoding and/or decoding. For example, FIG. 2A is a simplified schematic diagram of a communication system 140 having a transmitting device 142 in communication with a receiving device 144 via a suitable communication channel 146 such as an electrical cable, a fiber optic cable, a space, and/or the like.

In this example, the transmitting device 142 comprises an encoding module 100A functionally coupled to a transmitter 152. The encoding module 100A has a structure as shown in FIG. 1 and described above, and receives an input 148 having one or more data pieces and encodes the received one or more data pieces into one or more codewords for transmission by the transmitter 152 to the receiving device 144 via the communication channel 146.

The receiving device 144 comprises a receiver 154 functionally coupled to a decoding module 100B (which has a structure as shown in FIG. 1 and described above). The receiver 154 receives the one or more codewords transmitted from the transmitting device 142 and forwards the received codewords to the decoding module 100B. The decoding module 100B then decodes the one or more codewords into one or more data pieces for outputting through the output 156 for use or further processing.

Figure 2B:
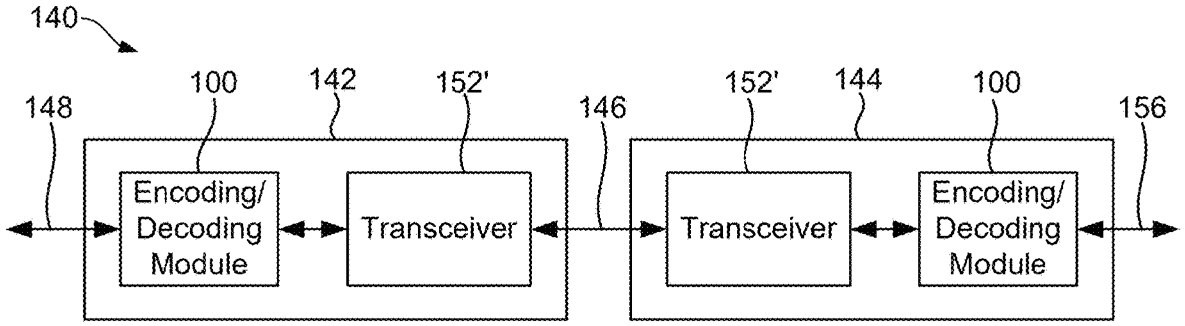
FIG. 2B is a simplified schematic diagram of a communication system having a transmitting device in communication with a receiving device via a communication channel, wherein each of the transmitting and receiving devices comprises an encoding/decoding module shown in FIG. 1, according to yet other embodiments of this disclosure.

As another example, FIG. 2B shows a communication system 140 having a transmitting device 142 in communication with a receiving device 144 via a suitable communication channel 146 such as an electrical cable, a fiber optic cable, a space, and/or the like.

The transmitting device 142 and receiving device 144 have a similar structure. In particular, each of the transmitting device 142 and receiving device 144 comprises an encoding/decoding module 100 (denoted a "codec" module) coupled to a transceiver module 152'. The encoding/decoding module 100 has a structure as shown in FIG. 1 for encoding data pieces to codewords and decoding codewords to data pieces. The transceiver module 152' is generally a combination of the transmitter 152 and receiver 154 shown in FIG. 2A.

Figure 2C:
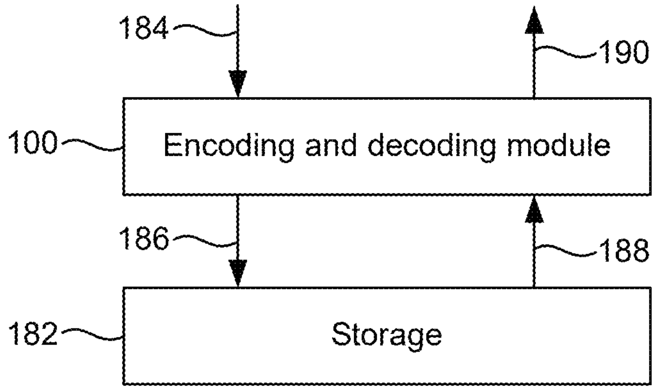
FIG. 2C is a simplified schematic diagram of a storage device comprising a storage module functionally coupled to an encoding/decoding module shown in FIG. 1, according to still some embodiments of this disclosure.

As yet another example, FIG. 2C shows a storage device 180 comprising a storage component 182 functionally coupled to an encoding and decoding module 100. The storage component 182 comprises one or more non-transitory computer-readable storage devices or media which may be volatile and/or non-volatile, non-removable or removable memory such as RAM, ROM, EEPROM, solid-state memory, hard disks, writable and/or rewritable CD, writable and/or rewritable DVD, flash memory, or the like.

When storing data to the storage device 180, the encoding and decoding module 100 receives data 184 to be written to the storage component 182, encodes the received data 184 into encoded data 186 such as one or more codewords, and writes the encoded data 186 to the storage component 182. When reading data from the storage device 180, the encoding and decoding module 100 reads encoded data 188 from the storage component 182, decodes the encoded data 188, and outputs the decoded data 190.

B. Low-Power QDE-Zipper Codes and Encoding Methods Therefor

A common purpose of using the encoding and decoding module 100 is for error detection and/or error correction. As those skilled in the art understand, various encoding and decoding methods (simply denoted "coding methods" hereinafter) such as forward error correction (FEC) coding methods have been used in prior art.

In concatenated forward error correction (FEC) methods and in the presence of probabilistic constellation shaping, lower hard-decision (HD) FEC overhead (OH) provides considerable performance gain. However, in the product-like codes, the main problem is large window memory (meaning high latency) in conventional methods such as staircase codes and diagonal-zipper codes, where the memory is increased exponentially by reducing the FEC OH.

Zipper codes represent a family of spatially-coupled product-like error-correcting encoding and decoding methods that have been widely used in fiber-optic communication system due to their good performance operating close to the binary symmetric channel (BSC) channel capacity. Zipper codes can be implemented similarly to what is described an article entitled "Zipper codes: Spatially-coupled product-like codes with iterative algebraic decoding", authored by Y. Sukmadji, U. Martinez-Peñas, and F. R. Kschischang, published in 16th Canadian Workshop on Information Theory (CWIT), June 2019, pp. 1-6, and U.S. Pat. No. 11,968,039 issued on Apr. 23, 2024, the content of each of which is incorporated herein by reference in its entirety.

Quasi-diagonal with extra level of protection (QDE) zipper code has been recently introduced to deal with this issue and reduce the memory of HD FEC significantly (about 15 to 30 times). This is achieved by defining a coupling factor which decreases the dependency of each component code to the older component codes and protecting each bit by three different Bose-Chaudhuri-Hocquenghem (BCH) component codes instead of two (which is the case for the conventional zipper framework codes).

Figure 3:
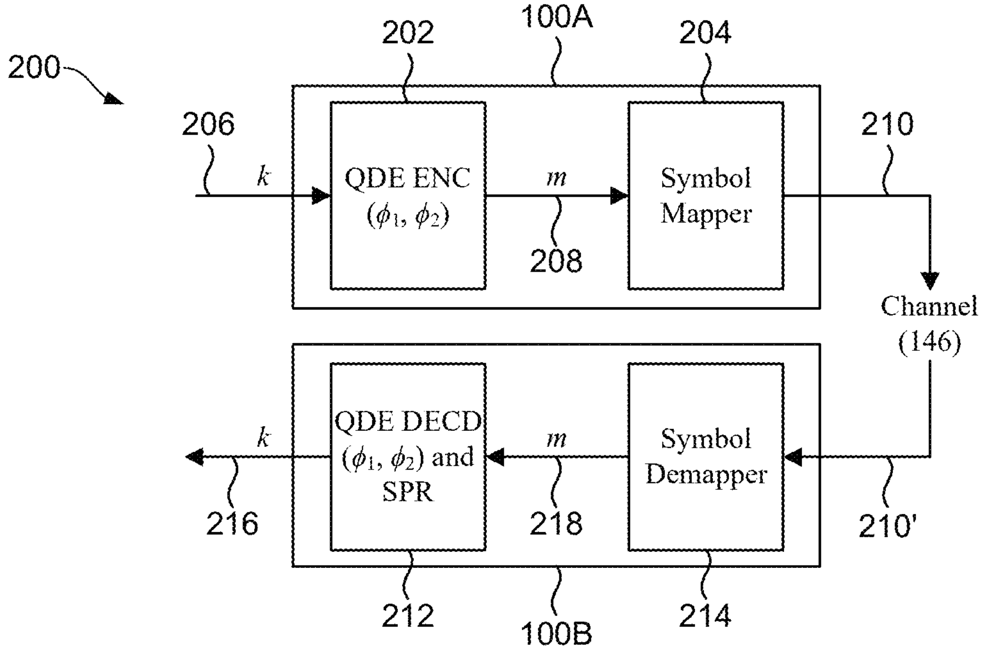
FIG. 3 is a schematic diagram showing the structure of a coding system having an encoder and a decoder using QDE-zipper code, according to some embodiments of this disclosure.

FIG. 3 is a schematic diagram showing the structure of a coding system 200 having an encoder 100A and a decoder 100B using QDE-zipper code, according to some embodiments of this disclosure. Comparing to the system 140 shown in FIG. 2A, the transmitter and receiver of the coding system 200 are not shown for ease of illustration. In this example, the coding system 200 is an optical system and the channel 146 is an optical channel.

As shown in FIG. 3, the encoder 100A of the coding system 200 comprises a QDE-zipper encoder 202 and a symbol mapper 204. The decoder 100B comprises a QDE-zipper decoder 212 and a symbol demapper 214.

On the encoder side, the QDE-zipper encoder 202 receives information bits 206 and encodes the information bits 206 into code bits 208, which is then mapped to suitable symbols 210 by the symbol mapper 204 for transmission to the decoder 100B via the channel 146 which may be an optical channel such as fiber optics.

On the decoder side, the received symbols 210' are converted to code bits 218 by the symbol demapper 214. The code bits 216 are then decoded by the QDE-zipper decoder 212 to obtain the decoded information bits 216 for output.

In conventional QDE-zipper code, which may be considered a conventional zipper code with a coupling factor larger than one, early error floor has been observed as a result of certain collection of non-correctable error bits. These set of errors are called "stall patterns" and the error floor is related to the size and number of these patterns within the structure of HD FEC methods. Such an error floor issue may occur when the correction capability is very small (such as t=1 or 2) or the available window decoding memory is very limited.

In these embodiments, a low-power QDE-zipper code and related encoding/decoding methods are used to solve the error floor issue in the conventional QDE-zipper code. More specifically, the low-power QDE-zipper code and related encoding/decoding methods use a new design of the two mapping functions ($\phi_1$, $\phi_2$) to remove or reduce stall patterns including small stall patterns. Comparing to the conventional QDE-zipper code, the low-power QDE-zipper code and related encoding/decoding methods may avoid more harmful stall patterns.

Figure 4:
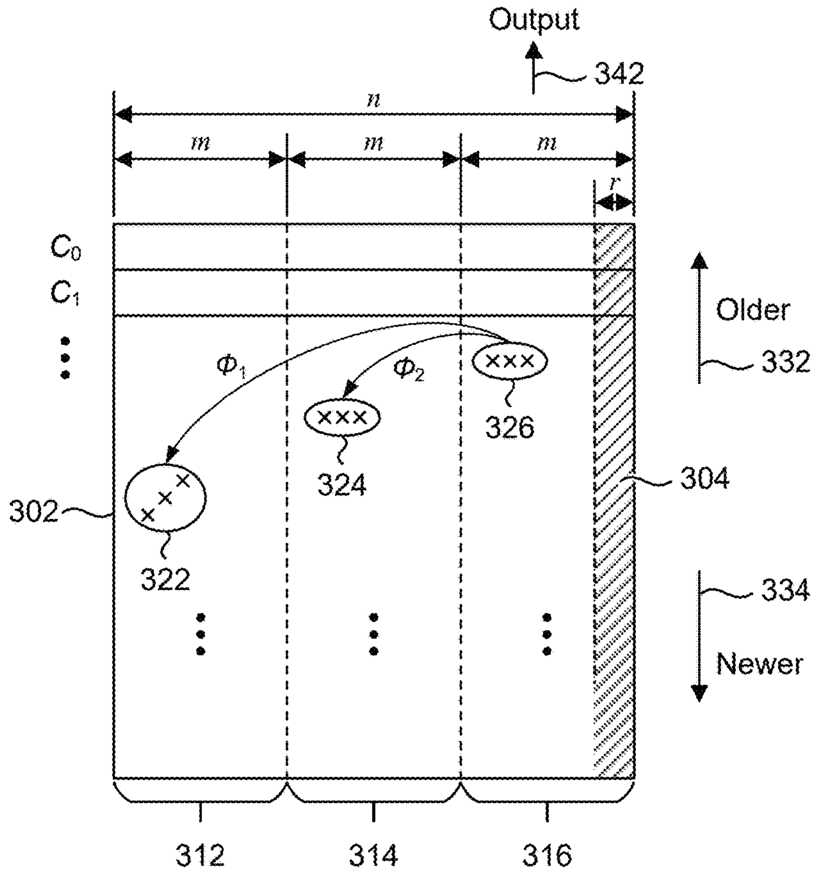
FIG. 4 is a schematic diagram showing a buffer associated with a low-power QDE-zipper code, according to some embodiments of this disclosure, the buffer comprising a real buffer, a first virtual buffer, and a second virtual buffer.

FIG. 4 is a schematic diagram showing a buffer associated with the low-power QDE-zipper code, according to some embodiments of this disclosure. In these embodiments, the QDE-zipper code increases the protection level of each bit from two levels to three levels and is able to remove various stall patterns such as the dominant small-sized stall patterns.

The QDE-zipper code is described by its component code and two interleaver mapping functions, denoted by ($\phi_1$, $\phi_2$), respectively (described in more detail later). The component code may be any suitable code such as BCH, extended-BCH (eBCH), double-extended-BCH (DeBCH) codes, or the like, with any given correction capability (such as $t \leq 4$). In this example, the component code is a BCH code C of length n, dimension n−r, and correction capability t, wherein each BCH codeword encodes k information bits, where k=n−r=3m−r.

As shown in FIG. 4, a QDE-zipper buffer 300 is defined as an infinite sequence of the component codewords such as BCH codewords $C_0$, $C_1$, $C_2$, . . . , which form a very large matrix 302 with n columns (that is, each row in the buffer 300 comprises a BCH codeword). In FIG. 4, the shaded zone 304 represents r columns of the parity bits. Herein, n=3m, and n, m and r are positive integers.

The QDE-zipper buffer 300 (or equivalently the matrix 302) is divided into three equal length buffers, including a first virtual buffer 312, a second virtual buffer 314, and a real buffer 316, each having m columns. Bits or symbols in the first virtual buffer 312 or second virtual buffer 314 are denoted "virtual bits" or "virtual symbols", and bits or symbols in the real buffer 316 are denoted "real bits" or "real symbols".

In the encoding process, each k information bits are sequentially filled or otherwise added to the next row of the real buffer 316, and the parity bits (that is, the bits in the same row of the parity zone 304) are generated based on the bits in the same row of the first virtual buffer 312, the second virtual buffer 314, and the real buffer 316 using the component code.

Except for the several rows at the beginning of the first and second virtual buffers 312 and 314, each virtual bit (that is, each bit in the first virtual buffer 312 or the second virtual buffer 314) is a copy of a real bit (that is, a bit in the real buffer 316) in a previous or preceding row. More specifically, the bits of the virtual buffers 312 and 314 are direct copies of the bits of the real buffer 316 using two interleaver mapping functions ($\phi_1$, $\phi_2$), respectively. To reduce the required memory, the two mapping functions ($\phi_1$, $\phi_2$) have coupling factors ($c_1$, $c_2$), respectively, which make it possible to copy more than one bit of a real row to a virtual buffer.

FIG. 4 shows an example of the interleaver mapping functions ($\phi_1$, $\phi_2$) with $c_1=c_2=c$. As shown, the interleaver mapping function $\phi_1$ partitions each row in the real buffer 316 into one or more groups with each group comprising $c_1$ bits ($c_1=c$ in this example), and copies each group 326 of $c_1$ bits into one or more subsequent rows 322 in the first virtual buffer 312. Therefore, the bit-distribution pattern in the first virtual buffer 312 repeats every $c_1$ bits.

Similarly, the interleaver mapping function $\phi_2$ partitions each row in the real buffer 316 (including the parity bits in that row) into one or more groups with each group comprising $c_2$ bits ($c_2=c$ in this example), and copies each group 326 of $c_2$ bits into one or more subsequent rows 324 in the second virtual buffer 314. Therefore, the bit-distribution pattern in the second virtual buffer 314 repeats every $c_2=c$ bits.

Therefore, generally, the virtual bits in each row have been filled with the real bits from previous rows when a new group of k information bits are filled into that row (in the real buffer 316), except for the first several rows wherein each unfilled virtual bit is considered to have a value of binary zero (0).

By building the buffer 302 as described above, the rows (or the bits therein) near the front of the buffer 302 are older (as indicated by the arrow 332) and the rows (or the bits therein) away from the front of the buffer 302 are newer (as indicated by the arrow 334). During the building of the buffer 302, real bits are output from the front of the buffer 302 (as indicated by the arrow 342), for example, to the symbol mapper 204. For example, the m bits in each row in the real buffer 316 (from older rows to newer rows) are output to the symbol mapper 204 to map to a symbol for transmitting through the channel 146.

In these embodiments, the interleaver mapping functions ($\phi_1$, $\phi_2$) distribute each group of c bits in each real row (that is, a row in the real buffer 316) into the next 3/2(m/c) virtual rows (that is, rows in the first and second virtual buffers 312 and 314), where m is the length of each row in the virtual and real buffers 312 to 316, and c is the coupling factor of the interleaver mapping functions ($\phi_1$, $\phi_2$), that is, $c_1=c_2=c$, such that the c mapped bits in either or both of the first and second virtual buffers 312 and 314 are distributed in different rows, thereby avoiding or at least reducing the occurrence of harmful stall patterns that may otherwise occur in conventional QDE-zipper code.

In some embodiments, the interleaver mapping functions ($\phi_1$, $\phi_2$) distribute the bits in each real row into the next 3/2(m/c) virtual rows such that, if the bit indices of the row in the first virtual buffer 312, the second virtual buffer 314, and the real buffer 316 are separately and correspondingly numbered, the real bits and the corresponding virtual bits distributed in any one of the $$\left(\frac{3}{2}\left(\frac{m}{c}\right)+1\right)$$

rows (that is, the row of the real bits and the next row 3/2(m/c) of the corresponding virtual bits) in the first virtual buffer 312, in any one of the $$\left(\frac{3}{2}\left(\frac{m}{c}\right)+1\right)$$

rows (that is, the row of the real bits and the next row 3/2(m/c) of the corresponding virtual bits) in the second virtual buffer 314, and in any one of the $$\left(\frac{3}{2}\left(\frac{m}{c}\right)+1\right)$$

rows (that is, the row of the real bits and the next row 3/2(m/c) of the corresponding virtual bits) in the real buffer 316 only overlap at one bit index, thereby avoiding or at least reducing the occurrence of harmful stall patterns that may otherwise occur in conventional QDE-zipper code.

For example, in some embodiments, the following interleaver mapping functions are used, wherein $\phi_1(i, j)$ maps the j-th bit (j=2m+1, . . . , 3m) of the i-th row in the real buffer 316 to $(i_1, j_1)$ (that is, $j_1$-th bit of the $i_1$-th row) in the first virtual buffer 312, and $\phi_2(i, j)$ maps the j-th bit (j=2m+1, . . . , 3m) of the i-th row in the real buffer 316 to $(i_2, j_2)$ (that is, $j_2$-th bit of the $i_2$-th row) in the second virtual buffer 314, and wherein the bit indices used in the following functions are numbered as [0, 1, . . . , n−1] for the entire codeword (that is, for the entire row across the first virtual buffer 312, the second virtual buffer 314, and the real buffer 316).

$$(i_1, j_1) = \phi_1(i, j) = \begin{cases} i + \left\lceil \frac{3}{2}\left(\frac{m}{c}\right) \right\rceil - (j - 2m)\ \%\ \left\lfloor \frac{m}{2c} \right\rfloor,\ (j - 2m), & j < \left\lfloor \frac{m}{2} \right\rfloor, \\ i + (j - 2m)\ \%\ \left\lfloor \frac{m}{2c} \right\rfloor + 1,\ (j - 2m), & \text{otherwise}, \end{cases} \quad (1)$$

$$(i_2, j_2) = \phi_2(i, j) = i + \left\lfloor \frac{(j - 2m)}{c} \right\rfloor + 1,\ (j - m), \quad (2)$$

where ⌈x⌉ is a function returning the smallest integer that is greater than or equal to x, ⌊y⌋ is a function returning the greatest integer that is smaller than y, and a % b represents the modulo function returning the remainder of a divided by b.

Figure 5:
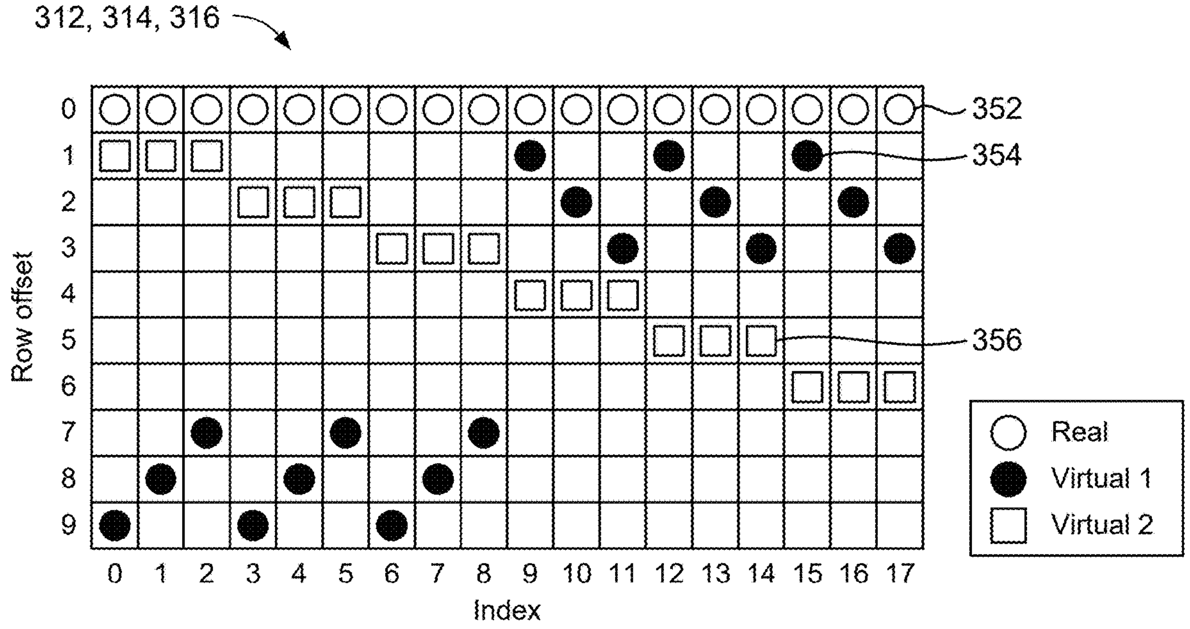
FIG. 5 is a schematic diagram showing an example of mapping a row of bits of the real buffer to the corresponding bits in the first and second virtual buffers, wherein the columns of the three buffers are separately and correspondingly indexed, and are shown in the same grid.

FIG. 5 is a schematic diagram showing an example of mapping a row of real bits 352 to the corresponding virtual bits 354 and 356 in the first and second virtual buffers 312 and 314, wherein n=54, m=18, $c_1=c_2=c=3$, and r=3. In this figure, the columns of the buffers 312 to 316 are separately and correspondingly indexed, and are shown in the same grid (that is, overlapped). Moreover, the offset value in FIG. 5 represents the row numbers relative to the row in the real buffer 316 that contains the real bits 352.

Figure 6:
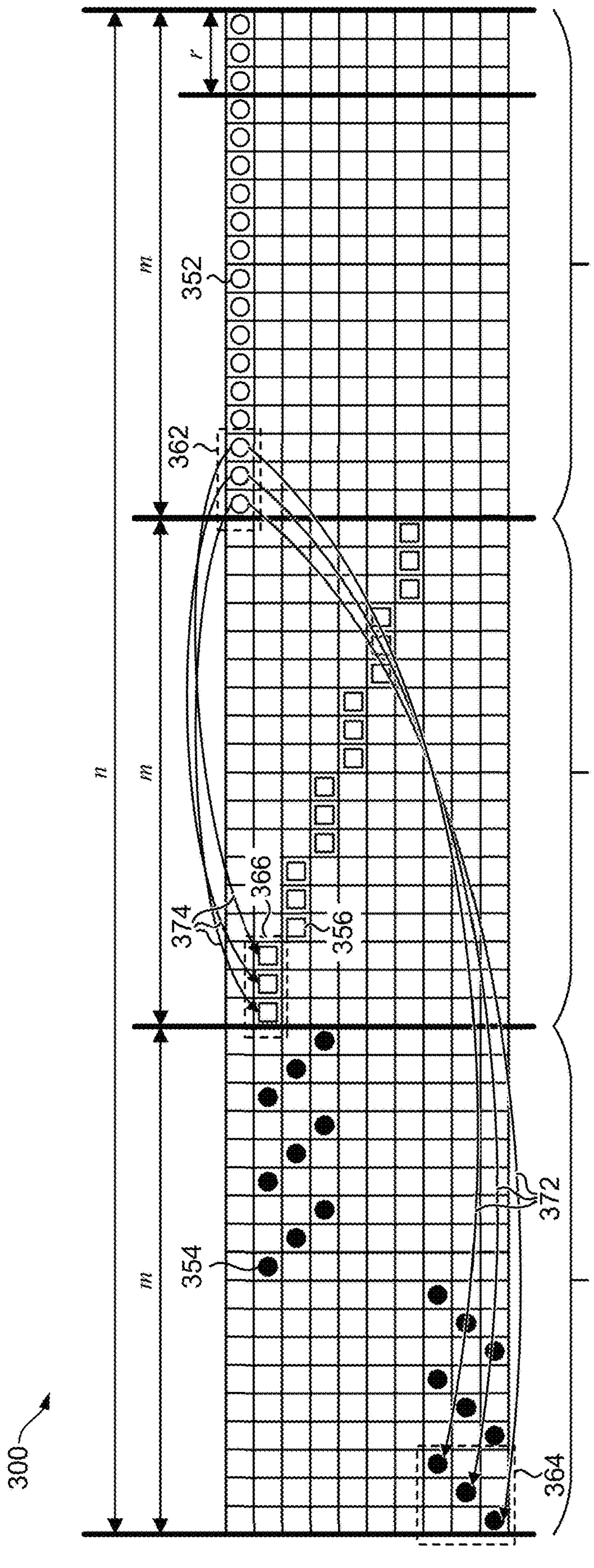
FIG. 6 is a schematic diagram showing a portion of the buffer shown in FIG. 4 for illustrating the example shown in FIG. 5, wherein the first virtual buffer, the second virtual buffer, and the real buffer are arranged side-by-side.

FIG. 6 is a schematic diagram showing a portion of the buffer 302 with the bits 352 in a row of the real buffer 316 and the corresponding virtual bits 354 and 356 in the first and second virtual buffers 312 and 214, respectively. FIG. 6 also illustrates the mapping from a group 362 of c real bits mapped to the group 364 of c virtual bits in the first virtual buffer 312 (as indicated by the arrows 372) and the group 366 of c virtual bits in the second virtual buffer 314 (as indicated by the arrows 374).

As can be seen, the row of real bits 352 are mapped to virtual bits 354 and 356 in $$\frac{3}{2}\left(\frac{m}{c}\right) = 9$$

subsequent rows. While each group of the real bits 352 (such as the group 362) are mapped to a group of c virtual bits (such as the group 366) in a same row in the second virtual buffer 314, the group of the real bits 352 are mapped to a group of c virtual bits (such as the group 364) in different rows in the first virtual buffer 312 (that is, the c mapped bits in either or both of the first and second virtual buffers 312 and 314 are distributed in different rows).

Figure 7:
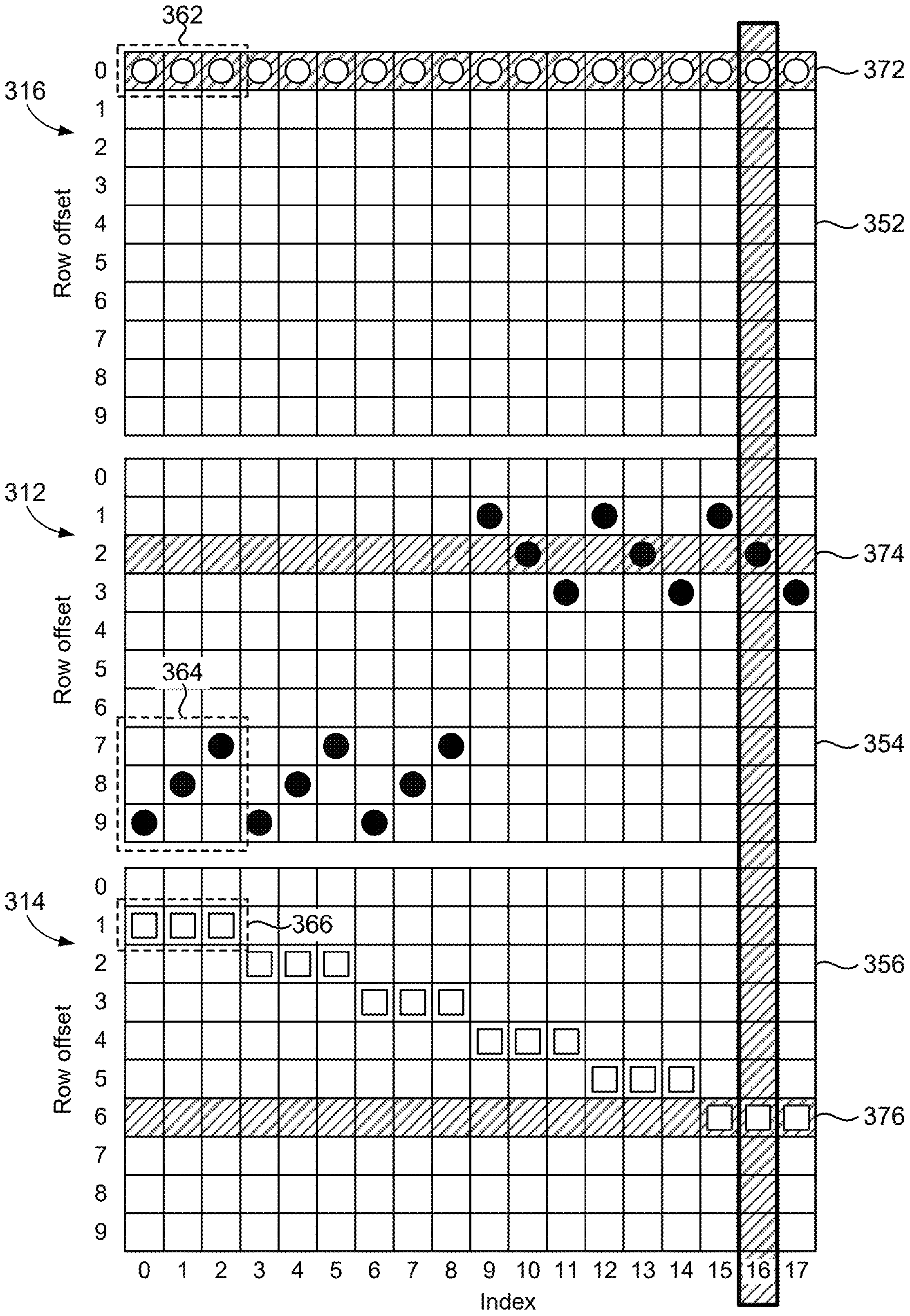
FIG. 7 is a schematic diagram for illustrating the example shown in FIG. 5, wherein the real buffer, the first virtual buffer, and the second virtual buffer are arranged in a non-overlapping manner and aligned in accordance with the bit index.

FIG. 7 is a schematic diagram showing the 10 rows of the real buffer 316, the first virtual buffer 312, and the second virtual buffer 314 in a non-overlapping manner and aligned in accordance with the bit index. As can be seen, the group 364 of the virtual bits mapped from the group 362 of the real bits are distributed in different rows in the first virtual buffer 312, while the group 366 of the virtual bits mapped from the group 362 of the real bits are distributed in the same row in the second virtual buffer 314.

Moreover, for any three rows respectively selected from the three buffers 312 to 316 (that is, one row selected from each buffer 312 to 316), the real and virtual bits 352, 354, and 356 therein (if any) overlap only at a single bit index (that is, the real and virtual bits 352, 354, and 356 in the selected rows only have one bit index in common) or not overlap at all (that is, the real and virtual bits 352, 354, and 356 in the selected rows only have no bit index in common).

For example, if row 372 in the real buffer 316 (that is, row offset zero (0) which contains 18 real bits at bit indices 0 to 17), row 374 in the first virtual buffer 312 (that is, row offset 2 which contains three virtual bits at bit indices 10, 13, and 16), and row 376 in the second virtual buffer 314 (that is, row offset 6 which contains three virtual bits at bit indices 15, 16, and 17) are selected, the real and virtual bits in the selected three rows only have one bit index 16 in common.

With the encoding method with above-described interleaver mapping functions, each bit is protected by three BCH component codewords (once in the real buffer 316 and two times in the virtual buffers 312 and 314) with the benefit of avoiding or at least reducing the occurrence of harmful stall patterns.

Figure 8:
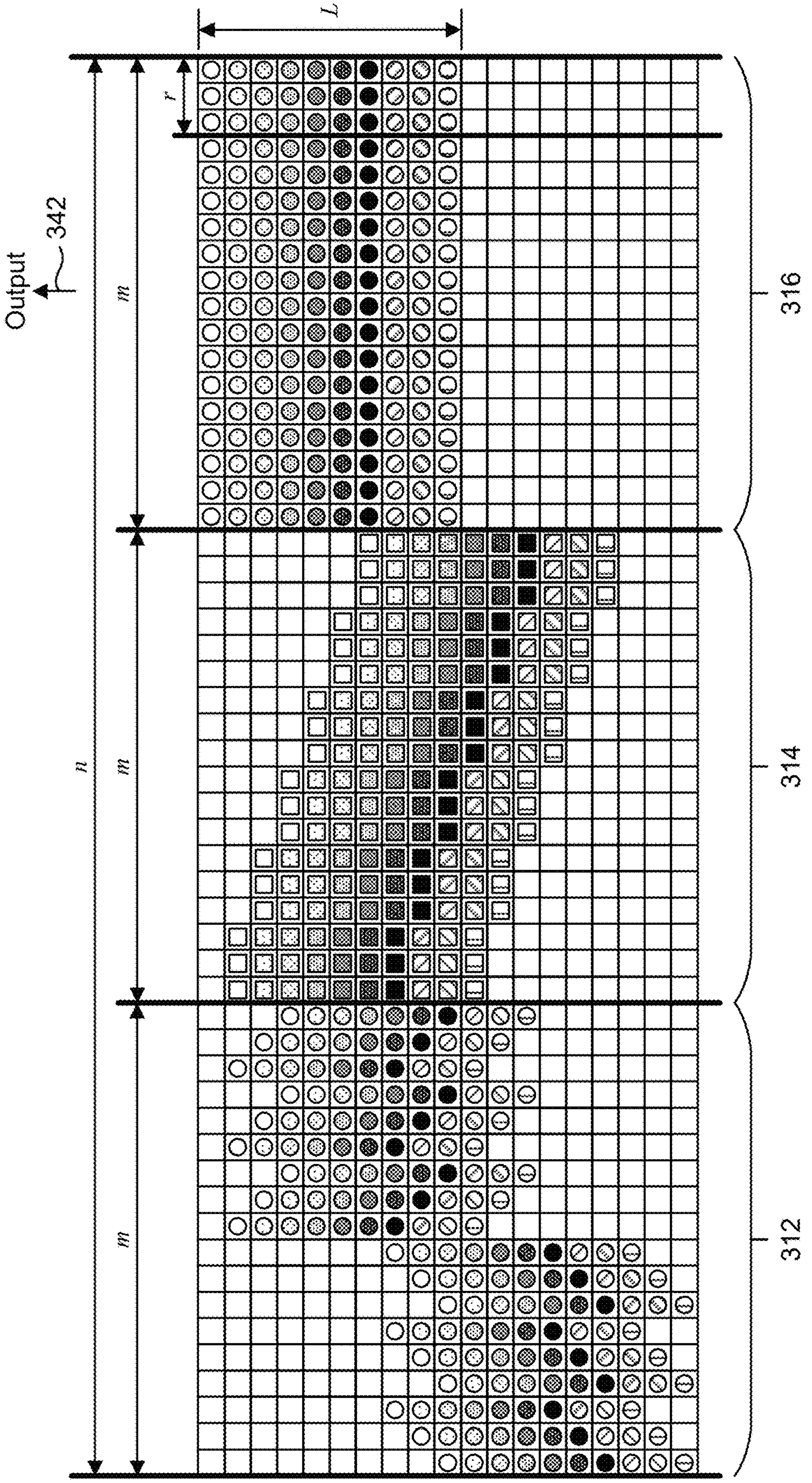
FIG. 8 is a schematic diagram showing a portion of the buffer shown in FIG. 4 filled with some rows of real bits and their mapped virtual bits.

FIG. 8 is a schematic diagram showing a portion of the buffer 300 filled with some rows of real bits and their mapped virtual bits. As can be seen, it generally takes $$\left(\frac{3}{2}\left(\frac{m}{c}\right) + 1\right)$$

rows of real bits to obtain a fully filled row of the buffer 300. In other words, a codeword in the buffer 300 may involve bits from 3/2(m/c) prior codewords.

C. Low-Power QDE-Zipper Codes and Decoding Methods Therefore

Figure 9:
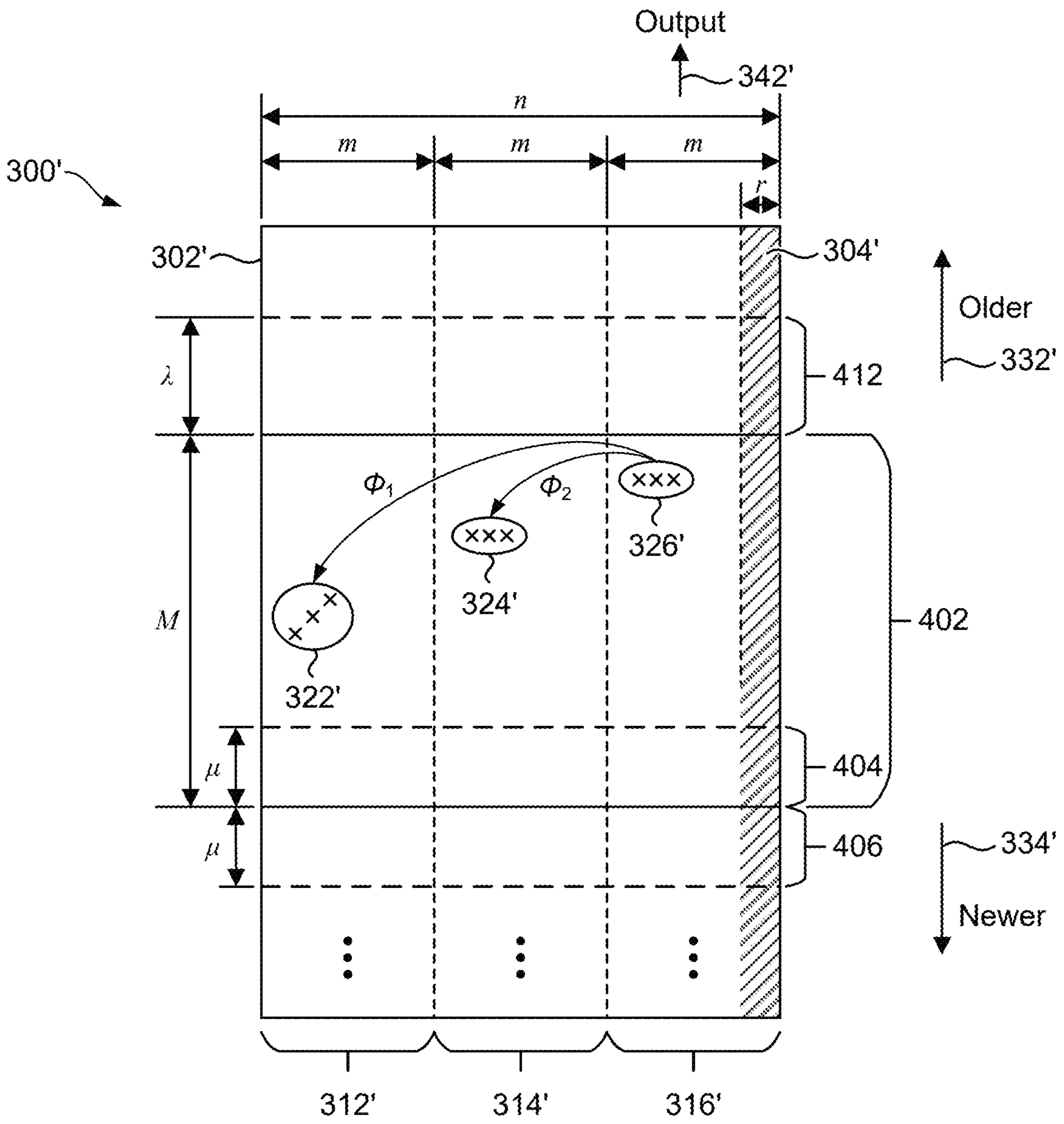
FIG. 9 is a schematic diagram showing the buffer associated with the low-power QDE-zipper code for illustrating a decoding procedure, according to some embodiments of this disclosure.

The low-power QDE-zipper code may be decoded using a sliding-window decoding method. As shown in FIG. 9, the decoder 212 forms a buffer 300' similar to the buffer 300 shown in FIG. 4, that is, having a real buffer 316', a first virtual buffer 312', and a second virtual buffer 314', each having m bits. The decoder 212 adds the received coded bits into the real buffer 316', starting from the beginning of the buffer 300', and then uses the interleaver mapping functions ($\phi_1$, $\phi_2$) to map each row of real bits to the first and second virtual buffers 312' and 314' as described above. Although not explicitly described herein, the reference numerals with affixed "'" are similar to those in FIG. 4.

The decoder 212 uses a sliding window 402 of M consecutive rows of the buffer 300' for iterative decoding using an algebraic BCH decoder. Generally, the ratio M/m is preferably a large value in practice for achieving a sharp waterfall performance. To reduce the decoding complexity, the decoder 212 may perform the sliding-window decoding each time when μ rows 404 (denoted a "chunk") of coded bits are received, wherein the sliding window 402 is advanced (away from the beginning of the buffer 300') such that the newly received chunk 404 forms the last μ rows of the sliding window 402. The decoder then decodes the current sliding window 402 using a bounded distance decoding (BDD). At the end of the decoding routine, the oldest μ rows (that is, the oldest chunk) are declared as the output of the window decoder.

When the next chunk 406 is received, the sliding window is again advanced such that the newly received chunk 406 forms the last μ rows of the sliding window 402. Thus, the decoder 212 generally iteratively decodes the sliding window 402 using BDD.

In sliding-window decoding, decoding each row requires access to previous rows (see FIG. 8), up to λ previous rows, wherein λ is a "maximum lookback" parameter dependent on the interleaver mapping functions $\phi_1$ and $\phi_2$.

As described above, in conventional QDE-zipper code, the error floor is related to the stall patterns, wherein a stall pattern in a zipper framework is a set of error locations in various rows of the real buffer 316 that cannot be corrected by the component decoder that is configured to correct up to t errors. Moreover, stall patterns may have an important impact on the error floor performance of the zipper codes.

QDE-zipper codes can provide good performance with low-latency. In some scenarios and applications, a hard-decision FEC method with even lower power consumption is required. Thus, in some embodiments, low-power QDE-zipper codes may be formed by either reducing the correction capability t of BCH component code or further reducing the memory size thereof. However, both of these solutions result in early error floor of QDE-zipper code due to the existence of stall patterns.

In some embodiments, the decoder 212 uses a stall pattern removal (SPR) method with low-complexity to detect and remove harmful stall patterns. Testing results show that the SPR method is suitable for detecting and removing dominant stall patterns of QDE-zipper code effectively with acceptable complexity.

In these embodiments, the decoder 212 uses an iterative decoding method. In each iteration, the decoder 212 processes the rows in the sliding window 402 one or more times for decoding. In the next iteration, the decoder 212 "slides down" the sliding window 402 by one chunk, in other words, removes the oldest chunk (at the top of the sliding window), moves all remaining rows upward, and receive a new chunk to the bottom of the sliding window, and then the decoder 212 processes the rows in the sliding window 402.

In these embodiments, the SPR method is performed in one or more iterations, for example, on the last chunk 404 at the end of the sliding window 402 in each iteration when the iteration is greater than a pre-determined value (iter≥i $ter_{SPR}$). To resolve the errors of a stall pattern, correcting a subset of real bits can result in the correction of whole stall pattern in the next iteration. Thus, in the SPR method aims at solving the errors within the first row of the stall pattern.

Figure 10:
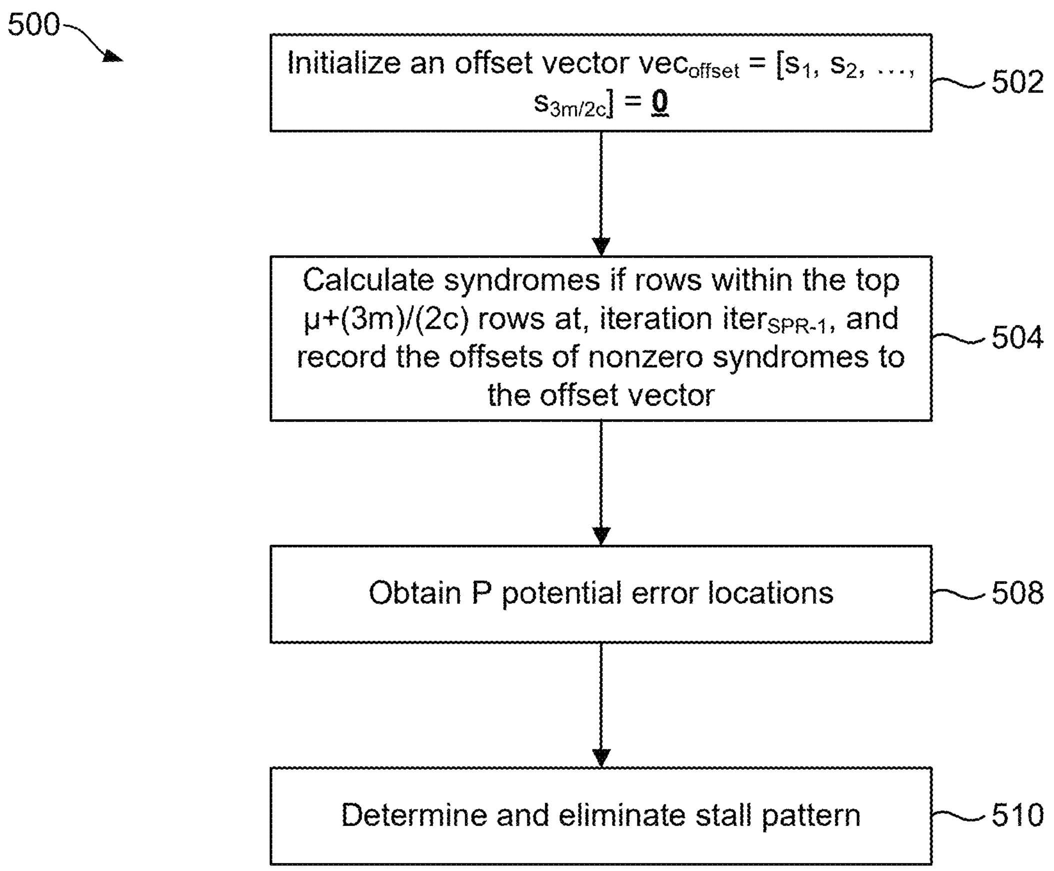
FIG. 10 is a flowchart showing the steps of a decoding procedure, according to some embodiments of this disclosure.

FIG. 10 is a flowchart showing the steps of the SPR method 500.

At iteration $iter_{SPR}-1$, the decoder 212 initializes a plurality of offset variables $s_1, s_2, \ldots,$ s3/2(m/c), collectively denoted as an offset vector $vec_{offset}$, by setting the value of each of these 3/2(m/c) variables to zero (0) (step 502), that is, $$vec_{offset} = \left[s_1, s_2, \ldots, s_{\frac{3}{2}\left(\frac{m}{c}\right)}\right] = \underline{0} \tag{3}$$

where "0" represents a vector of zeros.

The decoder 212 calculates the syndrome of each row (which is a component codeword) of the sliding window 402. If the syndrome of a row (denoted a "mapping row" as its bits in the real buffer 316' are mapped to the next 3/2(m/c) rows that will be used for stall pattern removal) is nonzero, the decoder 212 calculates the syndromes of the next 3/2 (m/c) rows (denoted "mapped rows").

Each offset variable of the offset vector $vec_{offset}$ corresponds to a respective one of the 3/2(m/c) mapped rows. Thus, the decoder 212 determines the value of each offset variable $s_k$ as one (1) if the syndrome of the corresponding row (that is, the k-th row of the 3/2(m/c) mapped rows) is nonzero (step 504), or as zero (0) if the syndrome of the corresponding row is zero.

Figure 11:
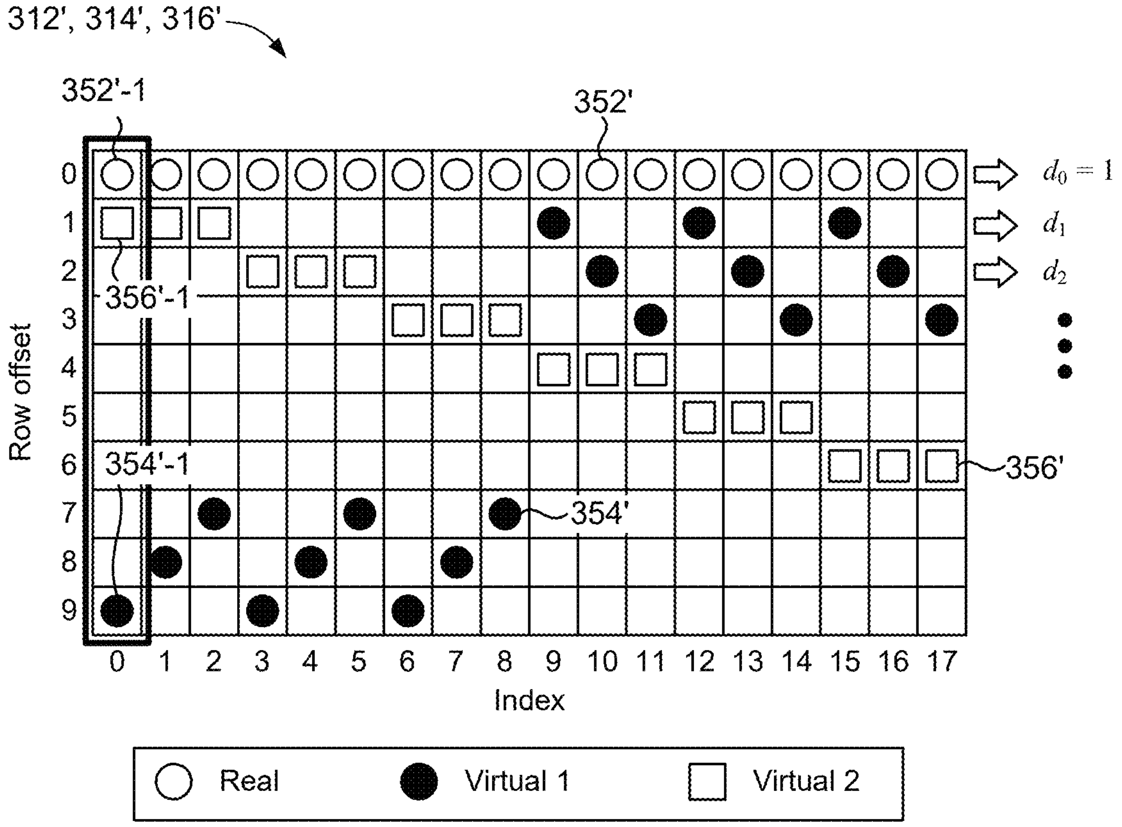
FIG. 11 is a schematic diagram showing an example of a portion of the buffer built by a decoder for decoding, according to some embodiments of this disclosure, wherein a row of bits of the real buffer are mapped to the corresponding bits in the first and second virtual buffers, and wherein the columns of the three buffers are separately and correspondingly indexed, and are shown in the same grid.

For example, as shown in FIG. 11, wherein the mapping row and the 3/2(m/c) mapped rows are continuously indexed from zero (0) to 3/2(m/c), and $$s_k = \begin{cases} 0, & \text{if } d_k \text{ is zero,} \\ 1, & \text{if } d_k \text{ is nonzero} \end{cases}, \tag{4}$$

for k=1, 2, . . . , 3/2(m/c), where $d_k$ is the syndrome of the k-th mapped row. In this example, the offset variables are initialized to zero (0). Thus, if $d_k$ is zero, the decoder 212 lets $s_k$ remain zero (0). If $d_k$ is nonzero, the decoder 212 sets the value of $s_k$ to one (1).

As another example, if rows are continuously indexed across the sliding windows, and the mapping row's index is $k_0$, the indices of the 3/2(m/c) mapped rows are $k_1, k_2, \ldots, k_{3/2(m/c)}$, and $$s_{k_i-k_0} = \begin{cases} 0, & \text{if } d_{k_i} \text{ is zero,} \\ 1, & \text{if } d_{k_i} \text{ is nonzero} \end{cases}, \tag{5}$$

where $d_{k_i}$ is the syndrome of the $k_i$-th row of the sliding window (and which is the $(k_i-k_0)$-the row of the 3/2(m/c) mapped rows). In this example, the offset variables are initialized to zero (0). Thus, if $d_{ki}$ is zero, the decoder 212 let $s_{k_i-k_0}$ remain zero (0). If $d_{k_i}$ is nonzero, the decoder 212 set the value of $s_{k_i-k_0}$ to one (1).

At step 508, the decoder 212 obtains P potential error locations, where P≥t is an integer.

As shown in FIG. 11, each bit 352' of the mapping row in the real buffer 316' shall be the same as the bits 354' and 356' in the respective mapped positions of the mapped rows in the first and second virtual buffers 312' and 214'. Then, for each bit in the real buffer 316', if the syndromes of the mapped rows in the first and second virtual buffers 312' and 214' are nonzeros, the corresponding bit in the real buffer 316' may be a corrupted bit.

For example, the first bit 352'-1 of the mapping row in the real buffer 316' are mapped to bit 354'-1 in the 9th mapped row in the first virtual buffer 312' and bit 356'-1 in the first mapped row in the second virtual buffer 314'. Therefore, if the syndromes $d_{k_1}$ and $d_{k_9}$ are nonzeros, the first bit 352'-1 in the real buffer 316' may be a corrupted bit.

Figure 12:
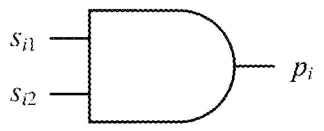
FIG. 12 is a schematic diagram showing obtaining potential error locations in the buffer built by the decoder for determining and eliminating a stall pattern.

Therefore, at step 508, for each bit in the real buffer 316', the syndromes of the mapped rows are combined to determine if the corresponding bit is a corrupted bit. More specifically, as the i-th bit in the real buffer 316' is mapped to the $(i_1)$-th row of the 3/2(m/c) mapped rows in the first virtual buffer 312' and the $(i_2)$-th row of the 3/2(m/c) mapped rows in the second virtual buffer 314', then, for the i-th bit $(i_\epsilon 0, \ldots, m-1)$ of the mapping row in the real buffer 316', the offset variables $s_{i_1}$ and $s_{i_2}$ are compared using an AND operation, as shown in FIG. 12, to obtain $p_i$ for indicating whether or not the i-th bit of the mapping row in the real buffer 316' is a potential error location. More specifically, the i-th bit of the mapping row in the real buffer 316' is a potential error location if $p_i=1$, and the i-th bit of the mapping row in the real buffer 316' is not a potential error location if $p_i=0$.

The decoder 212 checks a plurality of bits of the mapping row in the real buffer 316' to obtain P potential error locations, where $t \le P \le P_{max}$. In some embodiments, $P_{max}=m$ (that is, all potential error locations are collected). In some other embodiments, $P_{max}$ is a predefined value with $P_{max}<m$, such that a portion of the potential error locations are collected so as to reduce the computational cost of the next step.

Referring back to FIG. 10, at step 510, a stall pattern is determined and eliminated. More specifically, the decoder 212 calculates the syndromes of the mapping row for the $2^P-1$ possible bit-value combinations of the bits in the real buffer 312' at the collected P bits (that is, when these bits are flipped between binary zero (0) and binary (1); there are $2^P-1$ possible bit-value combinations because the syndrome of the original bit-value combination is already calculated and does not need to be calculated again).

If only one of the $2^P-1$ bit-value combinations gives rise to a zero-value syndrome, then, this bit-value combination is used as the corrected bit values of the collected P bits in the real buffer 312', thereby eliminating or removing the stall pattern.

If more than one of the $2^P-1$ bit-value combinations gives rise to syndromes having zero values, then, the bit-value combination that corresponds to one of the zero-value syndromes and has the smallest Hamming weight (that is, with least number of bits flipped) is used as the corrected bit values of the collected P bits in the real buffer 312', thereby eliminating or removing the stall pattern. Of course, in other embodiments, any bit-value combination that corresponds to one of the zero-value syndromes may be used as the corrected bit values of the collected P bits in the real buffer 312', thereby eliminating or removing the stall pattern.

Figure 13:
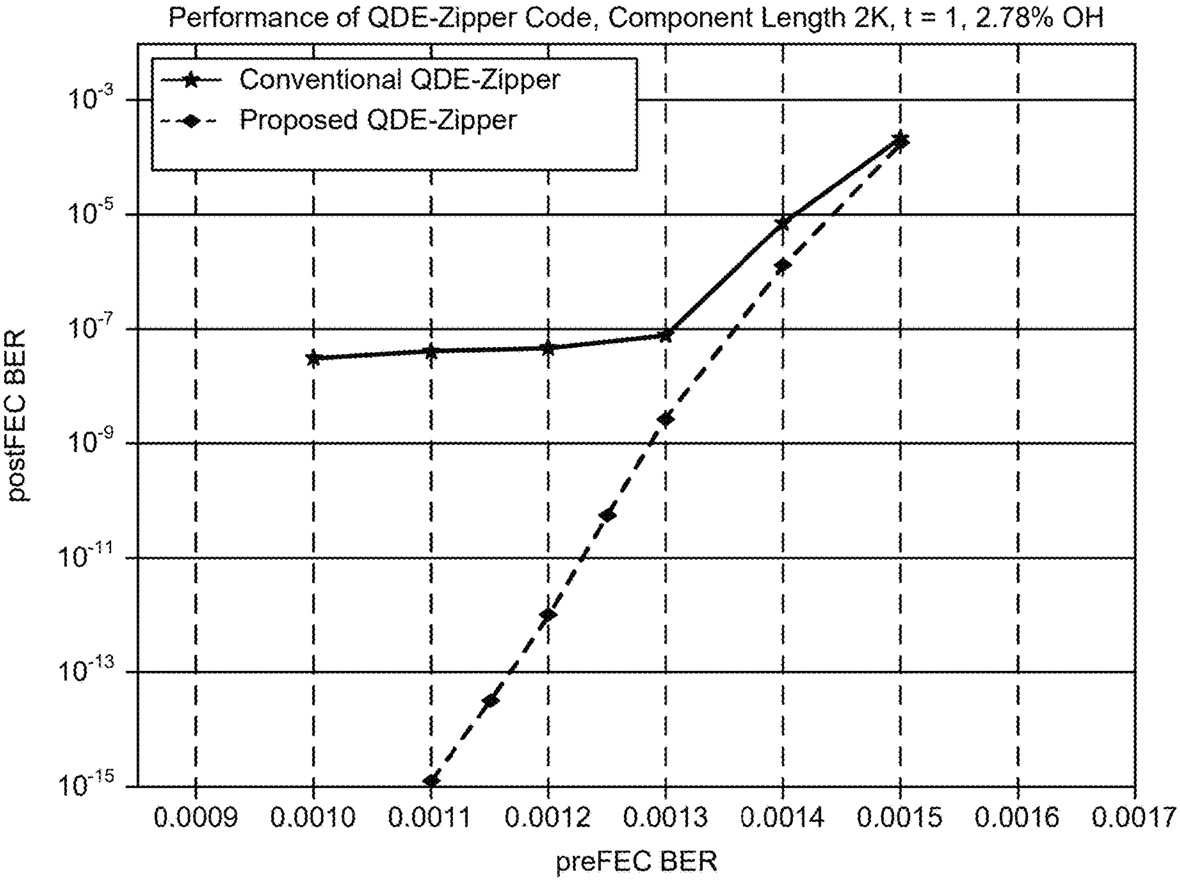
FIG. 13 is a plot showing the performance of the low-power QDE-zipper code for 2.78% overhead (OH) and double-extended Bose-Chaudhuri-Hocquenghem (DeBCH) component code with correction capability t=1.

FIG. 13 shows the performance of the low-power QDE-zipper code for 2.78% OH and DeBCH with correction capability t=1. The bit error rate (BER) reaches $10^{-15}$ thanks to the new design of QDE-zipper code and SPR method.

In above embodiments, the QDE-zipper buffer 300 (or equivalently the matrix 302) is divided into three equal length buffers, including a first virtual buffer 312, a second virtual buffer 314, and a real buffer 316, each having m columns. In some other embodiments, the length of the first virtual buffer 312 and/or the length of the second virtual buffer 314 may be smaller than the length of the real buffer 316.

Although in above embodiments, the buffer 300 is described as a matrix 302 and the terms "row" and "column" are used to describe the matrix 302 and thus the buffer 300, those skilled in the art will appreciate that such wording is for ease of description and for illustrative purposes only, and is not necessarily tied to specific implementations (such as implementation using a matrix). Those skilled in the art will appreciate that the same concepts may be described in other suitable ways. For example, the buffer 300 may not be described as a matrix, and the concepts of the terms "row" and "column" may be represented using other suitable terms (for example, the term "section" or "line" may be used to represent the concept of the term "row", and the term "position", "location", "index" may be use to represent the concept of the term "column").

Herein, various embodiments of low-power QDE-zipper codes and the encoding/decoding methods are disclosed, wherein the interleaver mapping functions used in both encoding and decoding procedures may avoid more harmful stall pattern structures than conventional QDE-zipper code. In some embodiments, a stall pattern removal method is also used in the decoding side.

In some embodiments, the encoding/decoding methods disclosed herein may be implemented as one or more circuits of a module, a device, an apparatus, a system, and/or the like. In some embodiments, the encoding/decoding methods disclosed herein may be implemented as computer-executable instructions stored in one or more non-transitory computer-readable storage devices such that, the instructions, when executed, may cause one or more circuits to perform the encoding/decoding methods disclosed herein.

The low-power QDE-zipper codes and the encoding/decoding methods disclosed herein are suitable for applications and products with low-overhead, low-latency, and low-power requirements, and may be used in applications and products where low-power and low-latency HD FEC is required, such as in optical communication systems that require low-power consumptions in a concatenated FEC structure.

The low-power QDE-zipper codes and the encoding/decoding methods disclosed herein provide enhanced robustness to early error floor in case of small correction capability of component code and small sliding-window memory size. Moreover, the coding methods disclosed herein may be extended to other spatially-coupled product-like codes such as staircase code, diagonal-zipper code, or other codes with higher level of protection than QDE-zipper code.

D. Acronym Key

| Acronym/Abbreviation/ Initialism | Full Name |
|---|---|
| FEC | Forward error correction |
| BCH | Bose-Chaudhuri-Hocquenghem |
| QDE | Quasi-diagonal with extra level of protection |
| SPR | Stall pattern removal |
| TEP | Test error pattern |
| OH | Overhead |
| BER | Bit error rate |

Those skilled in the art will appreciate that such various embodiments and/or features thereof may be customized and/or combined as needed or desired. Moreover, although embodiments have been described above with reference to the accompanying drawings, those of skill in the art will appreciate that variations and modifications may be made without departing from the scope thereof as defined by the appended claims.

What is claimed is:

1. A method for encoding a plurality of information bits into a plurality of coded bits, the method comprising:

encoding the plurality of information bits into the plurality of coded bits using a zipper code associated with a first mapping function $\phi_1$ and a second mapping function $\phi_2$;

wherein the zipper code is associated with a real buffer, a first virtual buffer, and a second virtual buffer, each comprising a plurality of sections;

wherein each section of the real buffer, a corresponding section of the first virtual buffer, and a corresponding section of the second virtual buffer form a codeword of a component code;

wherein the real buffer is for receiving the plurality of information bits into the plurality of sections thereof;

wherein the first mapping function $\phi_1$ and the second mapping function $\phi_2$ are for mapping each group of c bits, where c>1 is an integer, in each section of the real buffer to c mapped bits in one or more first subsequent sections of the first virtual buffer and to c mapped bits in one or more second subsequent sections of the second virtual buffer, respectively;

wherein the c mapped bits in the first virtual buffer are in different sections thereof, and/or the c mapped bits in the second virtual buffer are in different sections thereof; and wherein, when bit positions of the sections of the real buffer, bit positions of the sections of the first virtual buffer, and bit positions of the sections of the second virtual buffer are separately and correspondingly numbered, for each section of the real buffer, the bit positions of the bits in the section of the real buffer, the bit positions of the corresponding mapped buts in any one of the one or more first subsequent sections of the first virtual buffer, and the bit positions of the corresponding mapped bits in any one of the one or more second subsequent sections of the second virtual buffer only have one bit position in common.

2. The method of claim 1, wherein, when the bits of each section of the first virtual buffer are indexed from 1 to m (m>1 is an integer), the bits of each section of the second virtual buffer are indexed from m+1 to 2m, and the bits of each section of the real buffer are indexed from 2m+1 to 3m, the first mapping function $\phi_1$ maps j-th bit (j=2m+1, . . . , 3m) of i-th row of the real buffer to $j_1$-th bit of $i_1$-th row of the first virtual buffer, and $$(i_1, j_1) = \phi_1(i, j) = \begin{cases} i + \left\lceil \frac{3}{2}\left(\frac{m}{c}\right) \right\rceil - (j-2m)\ \%\ \left\lfloor \frac{m}{2c} \right\rfloor, (j-2m), & j < \left\lfloor \frac{m}{2} \right\rfloor, \\ i + (j-2m)\ \%\ \left\lfloor \frac{m}{2c} \right\rfloor + 1, (j-2m), & \text{otherwise,} \end{cases}$$

where $\lceil x \rceil$ is a function returning a smallest integer that is greater than or equal to x, $\lfloor y \rfloor$ is a function returning a greatest integer that is smaller than y, and $\alpha$ % b represents a modulo function returning a remainder of $\alpha$ divided by b, and the second mapping function $\phi_2$ maps the j-th bit of the i-th row of the real buffer to $j_2$-th bit of $i_2$-th row of the second virtual buffer, and $$(i_2, j_2) = \phi_2(i, j) = i + \left\lfloor \frac{(j-2m)}{c} \right\rfloor + 1, (j-m).$$

3. The method of claim 1, wherein c=3.

4. One or more processors functionally coupled to one or more non-transitory computer-readable storage devices, the one or more non-transitory computer-readable storage devices comprising computer-executable instructions, wherein the instructions, when executed, cause the one or more processors to perform a method comprising:

encoding a plurality of information bits into a plurality of coded bits using a zipper code associated with a first mapping function $\phi_1$ and a second mapping function $\phi_2$;

wherein the zipper code is associated with a real buffer, a first virtual buffer, and a second virtual buffer, each comprising a plurality of sections;

wherein each section of the real buffer, a corresponding section of the first virtual buffer, and a corresponding section of the second virtual buffer form a codeword of a component code;

wherein the real buffer is for receiving the plurality of information bits into the plurality of sections thereof;

wherein the first mapping function $\phi_1$ and the second mapping function $\phi_2$ are for mapping each group of c bits, where c>1 is an integer, in each section of the real buffer to c mapped bits in one or more first subsequent sections of the first virtual buffer and to c mapped bits in one or more second subsequent sections of the second virtual buffer, respectively;

wherein the c mapped bits in the first virtual buffer are in different sections thereof, and/or the c mapped bits in the second virtual buffer are in different sections thereof; and wherein, when bit positions of the sections of the real buffer, bit positions of the sections of the first virtual buffer, and bit positions of the sections of the second virtual buffer are separately and corresondingly numbered, for each section of the real buffer, the bit positions of the bits in the section of the real buffer, the bit positions of the corresponding mapped bits in any one of the one or more first subsequent sections of the first virtual buffer, and the bit positions of the corresponding mapped bits in any one of the one or more second subsequent sections of the second virtual buffer only have one bit position in common.

5. The one or more processors of claim 4, wherein, when the bits of each section of the first virtual buffer are indexed from 1 to m (m>1 is an integer), the bits of each section of the second virtual buffer are indexed from m+1 to 2m, and the bits of each section of the real buffer are indexed from 2m+1 to 3m, the first mapping function $\phi_1$ maps j-th bit (j=2m+1, . . . , 3m) of i-th row of the real buffer to $j_1$-th bit of $i_1$-th row of the first virtual buffer, and $$(i_1, j_1) = \phi_1(i, j) = \begin{cases} i + \left\lceil \frac{3}{2}\left(\frac{m}{c}\right) \right\rceil - (j-2m)\ \%\ \left\lfloor \frac{m}{2c} \right\rfloor, (j-2m), & j < \left\lfloor \frac{m}{2} \right\rfloor, \\ i + (j-2m)\ \%\ \left\lfloor \frac{m}{2c} \right\rfloor + 1, (j-2m), & \text{otherwise,} \end{cases}$$

where $\lceil x \rceil$ is a function returning a smallest integer that is greater than or equal to x, $\lfloor y \rfloor$ is a function returning a greatest integer that is smaller than y, and $\alpha$ % b represents a modulo function returning a remainder of $\alpha$ divided by b, and the second mapping function $\phi_2$ maps the j-th bit of the i-th row of the real buffer to $j_2$-th bit of $i_2$-th row of the second virtual buffer, and $$(i_2, j_2) = \phi_2(i, j) = i + \left\lfloor \frac{(j-2m)}{c} \right\rfloor + 1, (j-m).$$

6. The one or more processors of claim 4, wherein c=3.

7. One or more non-transitory computer-readable storage media comprising computer-executable instructions, wherein the instructions, when executed, cause one or more processors to perform a method comprising:

encoding a plurality of information bits into a plurality of coded bits using a zipper code associated with a first mapping function $\phi_1$ and a second mapping function $\phi_2$;

wherein the zipper code is associated with a real buffer, a first virtual buffer, and a second virtual buffer, each comprising a plurality of sections;

wherein each section of the real buffer, a corresponding section of the first virtual buffer, and a corresponding section of the second virtual buffer form a codeword of a component code;

wherein the real buffer is for receiving the plurality of information bits into the plurality of sections thereof;

wherein the first mapping function $\phi_1$ and the second mapping function $\phi_2$ are for mapping each group of c bits, where c>1 is an integer, in each section of the real buffer to c mapped bits in one or more first subsequent sections of the first virtual buffer and to c mapped bits in one or more second subsequent sections of the second virtual buffer, respectively;

wherein the c mapped bits in the first virtual buffer are in different sections thereof, and/or the c mapped bits in the second virtual buffer are in different sections thereof; and wherein, when bit positions of thee sections of the real buffer, bit positions of the sections of the first virtual buffer, and bit positions of the sections of the second virtual buffer are separately and corresponding numbered, for each section of the real buffer, the bit positions of the bits in the section of the real buffer, the bit positions of the corresponding mapped bits in any one of the one or more first subsequent sections of the first virtual buffer, and the bit positions of the corresponding mapped bits in any one of the one or more second subsequent sections of the second virtual buffer only have one bit position in common.

8. The one or more non-transitory computer-readable storage media of claim 7, wherein, when the bits of each section of the first virtual buffer are indexed from 1 to m (m>1 is an integer), the bits of each section of the second virtual buffer are indexed from m+1 to 2m, and the bits of each section of the real buffer are indexed from 2m+1 to 3m, the first mapping function $\phi_1$ maps j-th bit (j=2m+1, . . . , 3m) of i-th row of the real buffer to $j_1$-th bit of $i_1$-th row of the first virtual buffer, and $$(i_1, j_1) = \phi_1(i, j) = \begin{cases} i + \left\lceil \frac{3}{2}\left(\frac{m}{c}\right) \right\rceil - (j-2m) \ \% \ \left\lfloor \frac{m}{2c} \right\rfloor, (j-2m), & j < \left\lfloor \frac{m}{2} \right\rfloor, \\ i + (j-2m) \ \% \ \left\lfloor \frac{m}{2c} \right\rfloor + 1, (j-2m), & \text{otherwise}, \end{cases}$$

where $\lceil x \rceil$ is a function returning a smallest integer that is greater than or equal to x, $\lfloor y \rfloor$ is a function returning a greatest integer that is smaller than y, and α % b represents a modulo function returning α remainder of a divided by b, and the second mapping function $\phi_2$ maps the j-th bit of the i-th row of the real buffer to $j_2$-th bit of $i_2$-th row of the second virtual buffer, and $$(i_2, j_2) = \phi_2(i, j) = i + \left\lfloor \frac{(j-2m)}{c} \right\rfloor + 1, (j-m).$$

9. The one or more non-transitory computer-readable storage media of claim 7, wherein c=3.

10. A method comprising:

decoding a plurality of coded bits into a plurality of information bits using a zipper code associated with a first mapping function $\phi_1$ and a second mapping function $\phi_2$;

wherein the zipper code is associated with a real buffer, a first virtual buffer, and a second virtual buffer, each comprising a plurality of sections;

wherein each section of the real buffer, a corresponding section of the first virtual buffer, and a corresponding section of the second virtual buffer form a codeword of a component code;

wherein the real buffer is for receiving the plurality of coded bits into the plurality of sections thereof;

wherein the first mapping function $\phi_1$ and the second mapping function $\phi_2$ are for mapping bits in each section of the real buffer to a plurality of first subsequent sections of the first virtual buffer and to bits in one or more second subsequent sections of the second virtual buffer, respectively; and wherein said decoding the plurality of coded bits comprises:

determining that a syndrome of a first codeword is nonzero, the first codeword comprising a first one of the plurality of sections of the real buffer, and corresponding to plurality of second codewords comprising bits mapped from the bits of the first one of the plurality of sections of the real buffer, calculating syndromes of the plurality of second codewords, determining values of a plurality of variables, each of the plurality of variables corresponding to one of the plurality of second codewords, and having a value of binary zero if the syndrome of the corresponding second codeword is zero or a value of binary one if the syndrome of the corresponding second codeword is nonzero, and correcting a plurality of bits of the first one of the plurality of sections of the real buffer by determining values thereof based on the values of the plurality of variables.

11. The method of claim 10, wherein said correcting the plurality of bits of the first one of the plurality of sections of the real buffer comprises:

for each bit of the first one of the plurality of sections of the real buffer, combining a subset of the plurality of variables to obtain an indication, the subset of the plurality of variables corresponding to a subset of the plurality of second codewords that comprise the mapped bits mapped from the bit of the first one of the plurality of sections of the real buffer, and the indication indicating whether or not the corresponding bit of the first one of the plurality of sections of the real buffer is corrupted; and for P indications that indicate the corresponding bit is corrupted, selecting a possible value combination of the P corresponding bits that causes the first codeword to have a zero-value syndrome as the values thereof.

12. The method of claim 11, wherein the selected possible value combination of the P corresponding bits is a possible value combination that has a smallest Hamming weight and causes the first codeword to have the zero-value syndrome.

13. One or more processors functionally coupled to one or more non-transitory computer-readable storage devices, the one or more non-transitory computer-readable storage devices comprising computer-executable instructions, wherein the instructions, when executed, cause the one or more processors to perform a method comprising:

decoding a plurality of coded bits into a plurality of information bits using a zipper code associated with a first mapping function $\phi_1$ and a second mapping function $\phi_2$;

wherein the zipper code is associated with a real buffer, a first virtual buffer, and a second virtual buffer, each comprising a plurality of sections;

wherein each section of the real buffer, a corresponding section of the first virtual buffer, and a corresponding section of the second virtual buffer form a codeword of a component code;

wherein the real buffer is for receiving the plurality of coded bits into the plurality of sections thereof;

wherein the first mapping function $\phi_1$ and the second mapping function $\phi_2$ are for mapping bits in each section of the real buffer to a plurality of first subsequent sections of the first virtual buffer and to bits in one or more second subsequent sections of the second virtual buffer, respectively; and wherein said decoding the plurality of coded bits comprises:

determining that a syndrome of a first codeword is nonzero, the first codeword comprising a first one of the plurality of sections of the real buffer, and corresponding to plurality of second codewords comprising bits mapped from the bits of the first one of the plurality of sections of the real buffer, calculating syndromes of the plurality of second codewords, determining values of a plurality of variables, each of the plurality of variables corresponding to one of the plurality of second codewords, and having a value of binary zero if the syndrome of the corresponding second codeword is zero or a value of binary one if the syndrome of the corresponding second codeword is nonzero, and correcting a plurality of bits of the first one of the plurality of sections of the real buffer by determining values thereof based on the values of the plurality of variables.

14. The one or more processors of claim 13, wherein said correcting the plurality of bits of the first one of the plurality of sections of the real buffer comprises:

for each bit of the first one of the plurality of sections of the real buffer, combining a subset of the plurality of variables to obtain an indication, the subset of the plurality of variables corresponding to a subset of the plurality of second codewords that comprise the mapped bits mapped from the bit of the first one of the plurality of sections of the real buffer, and the indication indicating whether or not the corresponding bit of the first one of the plurality of sections of the real buffer is corrupted; and for P indications that indicate the corresponding bit is corrupted, selecting a possible value combination of the P corresponding bits that causes the first codeword to have a zero-value syndrome as the values thereof.

15. The one or more processors of claim 14, wherein the selected possible value combination of the P corresponding bits is a possible value combination that has a smallest Hamming weight and causes the first codeword to have the zero-value syndrome.

16. One or more non-transitory computer-readable storage media comprising computer-executable instructions, wherein the instructions, when executed, cause one or more processors to perform a method comprising:

decoding a plurality of coded bits into a plurality of information bits using a zipper code associated with a first mapping function $\phi_1$ and a second mapping function $\phi_2$;

wherein the zipper code is associated with a real buffer, a first virtual buffer, and a second virtual buffer, each comprising a plurality of sections;

wherein each section of the real buffer, a corresponding section of the first virtual buffer, and a corresponding section of the second virtual buffer form a codeword of a component code;

wherein the real buffer is for receiving the plurality of coded bits into the plurality of sections thereof;

wherein the first mapping function $\phi_1$ and the second mapping function $\phi_2$ are for mapping bits in each section of the real buffer to a plurality of first subsequent sections of the first virtual buffer and to bits in one or more second subsequent sections of the second virtual buffer, respectively; and wherein said decoding the plurality of coded bits comprises:

determining that a syndrome of a first codeword is nonzero, the first codeword comprising a first one of the plurality of sections of the real buffer, and corresponding to plurality of second codewords comprising bits mapped from the bits of the first one of the plurality of sections of the real buffer, calculating syndromes of the plurality of second codewords, determining values of a plurality of variables, each of the plurality of variables corresponding to one of the plurality of second codewords, and having a value of binary zero if the syndrome of the corresponding second codeword is zero or a value of binary one if the syndrome of the corresponding second codeword is nonzero, and correcting a plurality of bits of the first one of the plurality of sections of the real buffer by determining values thereof based on the values of the plurality of variables.

17. The one or more non-transitory computer-readable storage media of claim 16, wherein said correcting the plurality of bits of the first one of the plurality of sections of the real buffer comprises:

for each bit of the first one of the plurality of sections of the real buffer, combining a subset of the plurality of variables to obtain an indication, the subset of the plurality of variables corresponding to a subset of the plurality of second codewords that comprise the mapped bits mapped from the bit of the first one of the plurality of sections of the real buffer, and the indication indicating whether or not the corresponding bit of the first one of the plurality of sections of the real buffer is corrupted; and for P indications that indicate the corresponding bit is corrupted, selecting a possible value combination of the P corresponding bits that causes the first codeword to have a zero-value syndrome as the values thereof.

18. The one or more non-transitory computer-readable storage media of claim 17, wherein the selected possible value combination of the P corresponding bits is a possible value combination that has a smallest Hamming weight and causes the first codeword to have the zero-value syndrome.

* * * * *